(12) United States Patent
Tarui

(10) Patent No.: US 8,143,094 B2
(45) Date of Patent: Mar. 27, 2012

(54) SILICON CARBIDE SEMICONDUCTOR DEVICE AND MANUFACTURING METHOD THEREOF

(75) Inventor: Yoichiro Tarui, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/164,430

(22) Filed: Jun. 20, 2011

(65) Prior Publication Data

US 2011/0244643 A1 Oct. 6, 2011

Related U.S. Application Data

(62) Division of application No. 12/621,963, filed on Nov. 19, 2009.

(30) Foreign Application Priority Data

Apr. 8, 2009 (JP) ................................. 2009-094020

(51) Int. Cl.
*H01L 21/00* (2006.01)
*H01L 21/336* (2006.01)
*H01L 21/22* (2006.01)
*H01L 21/38* (2006.01)

(52) U.S. Cl. ......... 438/105; 438/542; 438/305; 438/549

(58) Field of Classification Search .................. 438/105, 438/285, 542, 545, 546, 549, 570, 369, 518, 438/519, 301, 305, 306, 308, 372, 373, 584, 438/587, 588

See application file for complete search history.

(56) References Cited

U.S. PATENT DOCUMENTS

| 4,780,426 | A | * | 10/1988 | Koshino et al. | ............... | 438/373 |
| 6,040,237 | A | * | 3/2000 | Bakowski et al. | ............ | 438/521 |
| 7,919,403 | B2 | | 4/2011 | Tarui | | |
| 2003/0020136 | A1 | * | 1/2003 | Kitabatake et al. | ........... | 257/502 |
| 2004/0183080 | A1 | * | 9/2004 | Kusumoto et al. | ............... | 257/77 |
| 2007/0045727 | A1 | * | 3/2007 | Shiraishi et al. | .............. | 257/335 |
| 2009/0250705 | A1 | | 10/2009 | Watanabe et al. | | |
| 2011/0195563 | A1 | | 8/2011 | Okuno et al. | | |

FOREIGN PATENT DOCUMENTS

EP 2 075 847 A1 7/2009

(Continued)

OTHER PUBLICATIONS

Chinese Office Action issued Jun. 27, 2011, in Patent Application No. 201010119238.8 (with English translation).

(Continued)

*Primary Examiner* — Chuong A. Luu

(74) *Attorney, Agent, or Firm* — Oblon, Spivak, McClelland, Maier & Neustadt, L.L.P.

(57) ABSTRACT

A manufacturing method of a silicon carbide semiconductor device in which an electric field applied to a gate oxide film can be relaxed and thereby reliability can be ensured, and by the method manufacturing costs can be reduced. Well regions, channel regions, and gate electrodes are formed so that, given that extending lengths, with respect to the inner sides of source regions, of each of the well regions, the channel regions, and the gate electrodes are Lwell, Lch, and Lg, respectively, a relationship of Lch<Lg<Lwell is satisfied; and the channel regions are further formed by diffusing by activation annealing boron as a third impurity, having been implanted by activation annealing into the source regions, into a silicon carbide layer.

4 Claims, 5 Drawing Sheets

FOREIGN PATENT DOCUMENTS

| | | |
|---|---|---|
| JP | 5-259443 | 10/1993 |
| JP | 2000-82812 | 3/2000 |
| JP | 2001-94097 | 4/2001 |
| JP | 2002-190594 | 7/2002 |
| JP | 2007-59636 | 3/2007 |
| KR | 1020070032708 A | 3/2007 |
| WO | WO 2006/006964 A1 | 1/2006 |

OTHER PUBLICATIONS

Office Action issued Jan. 19, 2011, in German Patent Application No. 10 2009 056 453.5-33 (with English translation).

Office Action issued May 2, 2011, in Korean Patent Application No. 10-2010-0000767 (with English-language translation).

* cited by examiner

SILICON CARBIDE SEMICONDUCTOR DEVICE AND MANUFACTURING METHOD THEREOF

CROSS-REFERENCE TO RELATED APPLICATIONS

This application is a divisional of U.S. application Ser. No. 12/621,963 filed Nov. 19, 2009, the entire content of which is incorporated herein by reference, and claims priority under 35 U.S.C. 119 to Japanese Application No. 2009-094020 filed Apr. 8, 2009.

BACKGROUND OF THE INVENTION

1. Field of the Invention

The present invention relates to a silicon carbide semiconductor device having a gate structure whose capacitance is reduced, and to its manufacturing method.

2. Description of the Related Art

Silicon carbide (SiC) material has a band gap approximately three times wider, a dielectric breakdown voltage approximately ten times higher, and a thermal conductivity approximately three times higher than those of conventional silicon (Si) material. Accordingly, a semiconductor device (silicon carbide semiconductor device) manufactured using a silicon carbide substrate is characterized in that the device can operate at higher temperature with lower resistivity compared to that (silicon semiconductor device) manufactured using a silicon substrate. Particularly, in a MOSFET (metal oxide semiconductor field effect transistor) or an IGBT (insulated gate bipolar transistor) as a silicon carbide semiconductor device, losses when current flows and when switching operation is performed can be reduced compared to that as a silicon semiconductor device. Specifically, when operated to switch at a high speed, the MOSFET or the IGBT as a silicon carbide semiconductor device has been found to be more effective in loss reduction than that as a silicon semiconductor device.

By the way, when the MOSFET or the IGBT as a silicon carbide semiconductor device is operated to switch at a high speed, its gate capacitance is important to be reduced.

FIG. 9 is a sectional view illustrating a conventional planar MOSFET having a gate structure in which the gate capacitance is reduced, according to those disclosed, for example, in Japanese Patent Application Publication Laid-Open No. 2002-190594 and No. 2007-59636. Moreover, FIG. 10 through FIG. 14 are explanatory views illustrating a general manufacturing process for the planar MOSFET represented in FIG. 9.

A manufacture process for the conventional planar MOSFET and its structure are explained with reference to FIG. 9 through FIG. 14.

First, an n⁻-type silicon carbide layer 102 is formed, using a vapor-phase epitaxial growth method, on a surface of an n-type silicon carbide substrate 101. Next, well regions 104 are formed, in selected regions of the silicon carbide layer 102, by ion implantation (indicated by arrows A) of aluminum (Al) as a p-type impurity, using a resist layer 103 as a mask therefor. After the ion implantation, the resist layer 103 is removed (refer to FIG. 10).

Then, source regions 106 are formed, in selected regions of the well regions 104, by ion implantation (indicated by arrows B) of nitrogen (N) or phosphorus (P) as an n-type impurity, using a resist layer 105 as a mask therefor. After the ion implantation, the resist layer 105 is removed (refer to FIG. 11).

Contact regions 108 are formed, so as to contact outer side portions of the source regions 106, by ion implantation (indicated by arrows C) of aluminum (Al) as a p-type impurity, using a resist layer 107 as a mask therefor (refer to FIG. 12).

After the resist layer 107 has been removed, activation annealing is performed (for example, at 1500 degrees C. in argon (Ar) atmosphere for 30 minutes) (refer to FIG. 13).

A gate oxide film 109 is formed, by a thermal oxidation method, on the entire surface of the silicon carbide layer 102. Then, a polysilicon film is formed by a chemical vapor-phase growth method, etc. on the gate oxide film 109, and thereafter, gate electrodes 110 are formed by removing unnecessary portions thereof by a dry etching method, etc., using a resist layer as a mask therefor. In this process, the gate electrodes 110 are not formed over a depletion region 111 that is a portion of the silicon carbide layer 102 sandwiched between the well regions 104 (refer to FIG. 14).

After an interlayer insulating film 112 has been formed by a chemical vapor-phase growth method over the surfaces of the gate oxide film 109 and the gate electrodes 110, unnecessary portions thereof are removed by a dry etching method, etc., using a resist layer as a mask therefor.

A source electrode 113 is formed by a physical vapor-phase growth method, etc. on the surfaces of the exposed contact regions 108, source regions 106, and interlayer insulating film 112 (refer to FIG. 14).

Last, a drain electrode 114 is formed by a physical vapor-phase growth method, etc. on the rear surface of the silicon carbide substrate 101; thus, the planar MOSFET illustrated in FIG. 9 is completed.

SUMMARY OF THE INVENTION

In the case of the planar MOSFET represented in FIG. 9, although the gate capacitance can be realized to be reduced, because a high electric field is applied at the gate-electrode edges, indicated by "E" in FIG. 9, inside the gate electrodes 110, that is, at the gate-electrode edges, positioned over the depletion region 111, of the gate electrodes 110, a problem occurs that reliability of the gate oxide film 109 is deteriorated. Especially, because the dielectric strength of a silicon carbide device is higher by one order of magnitude than that of a silicon device, the electric field at the gate-electrode edges becomes larger by one order of magnitude than that of the silicon device. Therefore, the problem becomes more significant that the reliability of the gate oxide film 109 is deteriorated. This problem similarly occurs also in a planar IGBT having a gate structure similar to that of the planar MOSFET. Moreover, from a commercial view point, increase of the manufacturing cost is also needed to be prevented for solving the problem.

A first objective of the present invention, which is made to solve the above described problem, is to provide a silicon carbide semiconductor device in which the electric field applied to the gate oxide film 109 can be relaxed even when a strong electric field is generated at the gate-electrode edges positioned over the depletion region 111 in inner sides of the gate electrodes 110, and thereby reliability of the gate oxide film 109 can be ensured, and to provide a manufacturing method of the silicon carbide semiconductor device.

Moreover, a second objective of the present invention is to provide a silicon carbide semiconductor device, and to provide its manufacturing method, in which, when the first objective is realized, increase of the manufacturing cost can be prevented as much as possible.

A manufacturing method of a silicon carbide semiconductor device includes a step of forming inside a first conductive-type silicon carbide layer second conductive-type well regions by ion-implanting a first impurity that does not diffuse by activation annealing but forms a second conductive-type region in the silicon carbide layer, a step of forming in regions sandwiched between a surface of the silicon carbide layer and their respective well regions first conductive-type source regions by ion-implanting a second impurity that does not diffuse by the activation annealing but forms a first conductive-type region in the silicon carbide layer, and a third impurity that diffuses by the activation annealing and forms a second conductive-type region in the silicon carbide layer, a step of forming, in regions sandwiched between the surface of the silicon carbide layer and their respective well regions, and in the silicon carbide layer on inner outsides of the source regions, second conductive-type channel regions by diffusing by the activation annealing the third impurity having been included in the source regions, and a step of forming over the surface of the silicon carbide layer gate electrodes, intervening between the surface and the electrodes a gate insulation film, so as to cover the channel regions, a part of a surface-exposed portion of the silicon carbide layer in inner outsides of the channel regions, and a part of the source regions; and the manufacturing method is characterized in that the well regions, the channel regions, and the gate electrodes are formed so that, given that extending lengths, with respect to the inner sides of the source regions, of each of the well regions, the channel regions, and the gate electrodes are Lwell, Lch, and Lg, respectively, a relationship of Lch<Lg<Lwell is satisfied.

DETAILED DESCRIPTION OF THE PREFERRED EMBODIMENT

Embodiment 1

Figure 7:
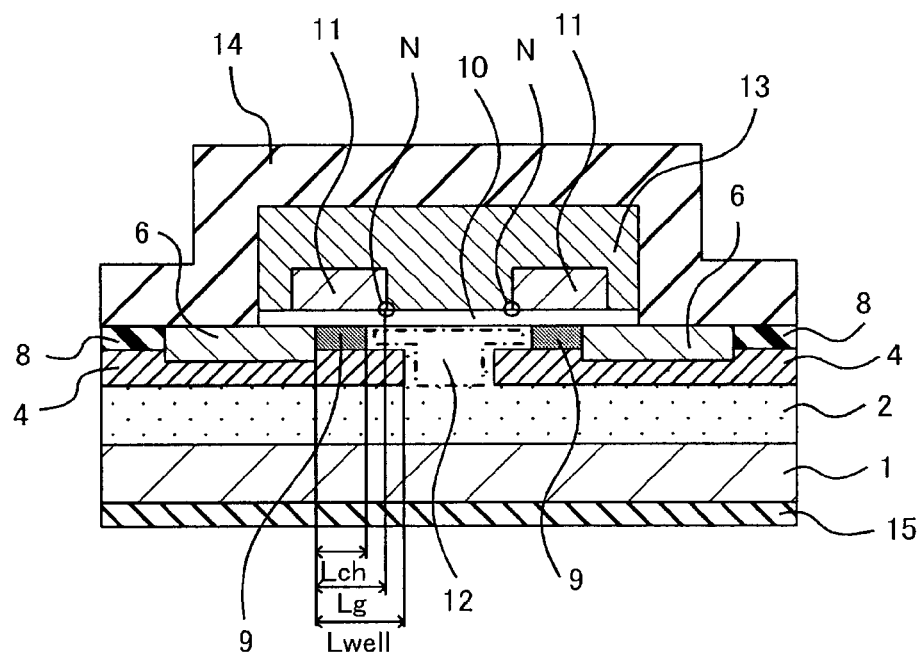
FIG. 7 is a cross-sectional view representing the silicon carbide semiconductor device according to Embodiment 1 of the present invention.

A silicon carbide semiconductor device according to Embodiment 1 of the present invention is explained for a case of a planar MOSFET. FIG. 1 through FIG. 6 are explanatory views representing manufacturing processes for the planar MOSFET. FIG. 7 is a cross-sectional view illustrating a structure of the planar MOSFET obtained by the manufacturing processes.

The manufacture processes for the planar MOSFET and its structure according to the present invention are explained with reference to FIG. 1 through FIG. 7.

First, an $n^-$-type (first conductive type) silicon carbide layer 2 is formed, by an epitaxial crystal growth method, on a surface of an n-type (first conductive type) silicon carbide substrate 1. A silicon carbide wafer is configured with the silicon carbide substrate 1 and the silicon carbide layer 2 (refer to FIG. 1).

Next, p-type (second conductive type) buried well regions 4 having a predetermined gap between them are selectively formed inside the silicon carbide layer 2 at a predetermined depth from the surface of the layer 2 by ion-implantation (represented by arrows "G") of p-type impurities, using a resist layer 3 as a mask therefor. Here, aluminum (Al) is used as the impurity to form the p-type region in the silicon carbide layer 2. After the ion implantation, the resist layer 3 is removed. The depth of the well regions 4 formed by the ion-implantation is controlled by the acceleration voltage of the ions implanted; therefore, the acceleration voltage is set so that the well regions 4 are formed to have at a predetermined depth inside the silicon carbide layer 2 (refer to FIG. 1).

Figure 1:
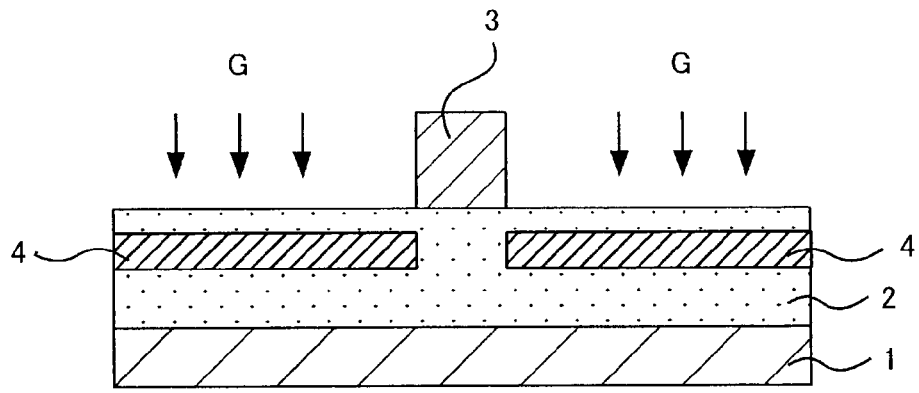
FIG. 1 is an explanatory view representing a manufacturing process for a silicon carbide semiconductor device according to Embodiment 1 of the present invention.
Figure 2:
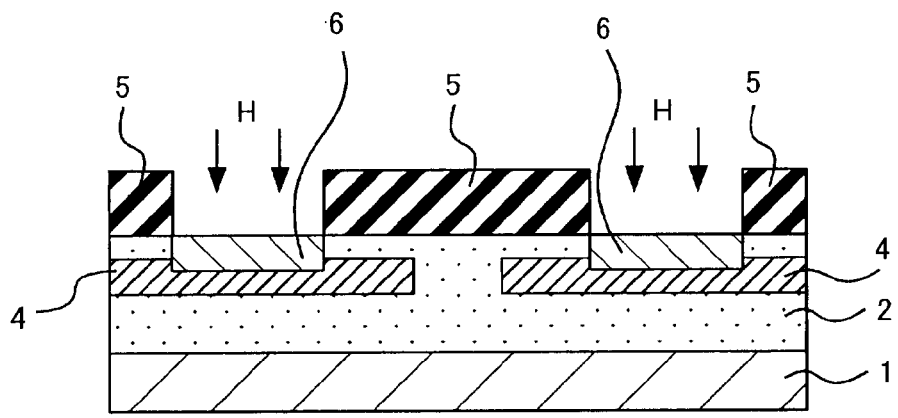
FIG. 2 is an explanatory view representing a manufacturing process for the silicon carbide semiconductor device according to Embodiment 1 of the present invention.
Figure 3:
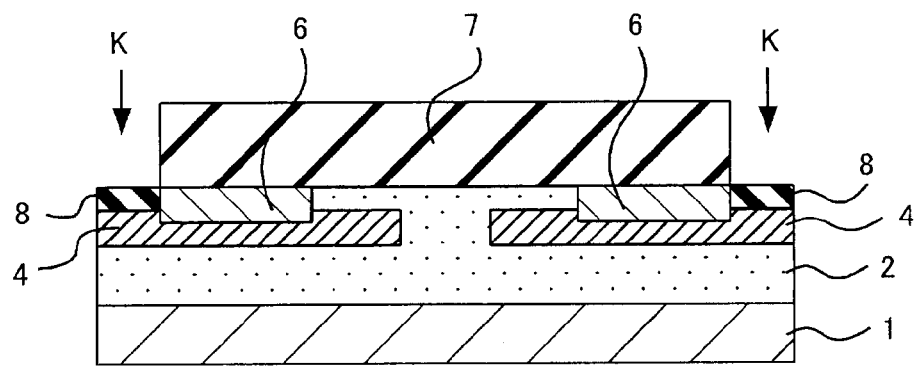
FIG. 3 is an explanatory view representing a manufacturing process for the silicon carbide semiconductor device according to Embodiment 1 of the present invention.

Next, n-type (first conductive type) source regions 6 are selectively formed, by sequential ion-implantation (represented by arrows "H") of n-type impurities and p-type impurities, on the well regions 4, that is, in portions of the silicon carbide layer 2 sandwiched between the surface of the silicon carbide layer 2 and the well regions 4, using a resist layer 5 as a mask therefor. The concentration of the n-type impurities of the source regions 6 is set to be relatively higher than that of the silicon carbide layer 2. Here, nitrogen (N) or phosphorus (P) can be used as the impurity to form the n-type region in the silicon carbide layer 2, while boron (B) is used as the p-type impurity to be implanted. By setting the implantation amount of boron to be smaller than that of nitrogen or phosphorus, the source regions 6 are necessary to be n-type after the implantation. The implanted elemental boron is also necessary to have reached the well regions 4. The source regions 6 may penetrate into the well regions 4 as represented in FIG. 2. After the ion implantation, the resist layer 5 is removed. Here, the depth of the source regions 6 formed by the ion implantation is controlled by the acceleration voltage of the implanted ions; therefore, the acceleration voltage is set to obtain a predetermined depth. The order of the ion implantation steps for nitrogen or phosphorus as the n-type impurities and those for boron as the p-type impurities may be reversed (refer to FIG. 2).

Next, p$^+$-type (second conductive type) contact regions 8 are selectively formed, by ion-implantation (represented by arrows "K") of p-type impurities, in other portions on the well regions 4, sandwiched between the surface of the silicon carbide layer 2 and the well regions 4, using a resist layer 7 as a mask therefor. The contact regions 8 are formed so as to contact the outer sides (non-opposing sides) of the source regions 6. The impurity concentration in the contact regions 8 is set to be relatively higher than that of the well regions 4. Aluminum is used as the impurity to form the p-type region in the silicon carbide layer 2. After the ion implantation, the resist layer 7 is removed. Here, the depth of the contact regions 8 formed by the ion implantation is controlled by the acceleration voltage of the implanted ions; therefore, the acceleration voltage is set to obtain a predetermined depth (refer to FIG. 3).

Next, activation annealing is performed (for example, at 1500 degrees C. in argon (Ar) atmosphere for 30 minutes) for the resultant silicon carbide wafer. According to this annealing, the implanted ions are electrically activated, and the crystal defect generated by the ion implantation is recovered (refer to FIG. 4).

Figure 4:
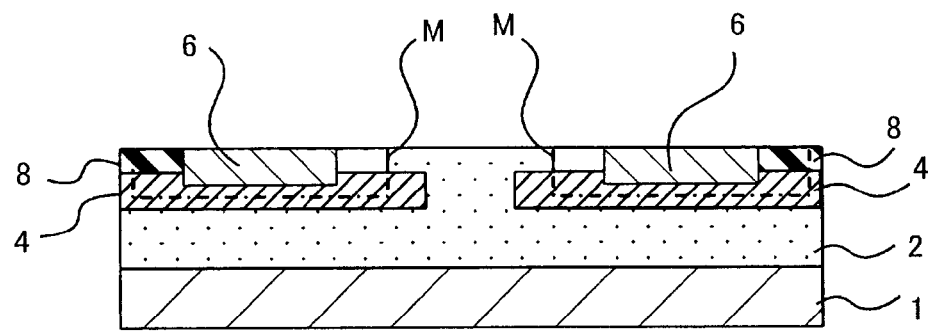
FIG. 4 is an explanatory view representing a manufacturing process for the silicon carbide semiconductor device according to Embodiment 1 of the present invention.
Figure 5:
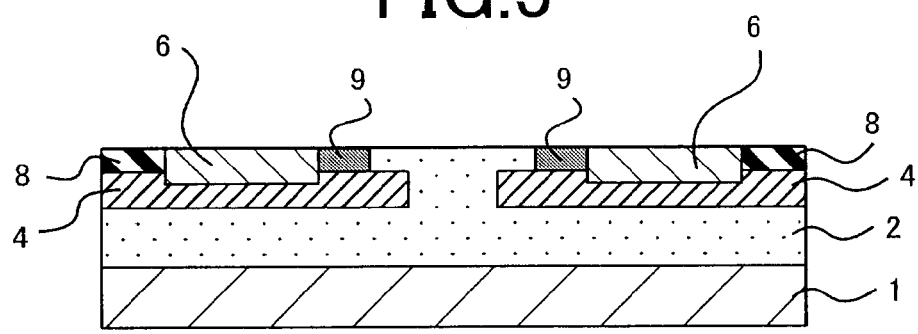
FIG. 5 is an explanatory view representing a manufacturing process for the silicon carbide semiconductor device according to Embodiment 1 of the present invention.
Figure 6:
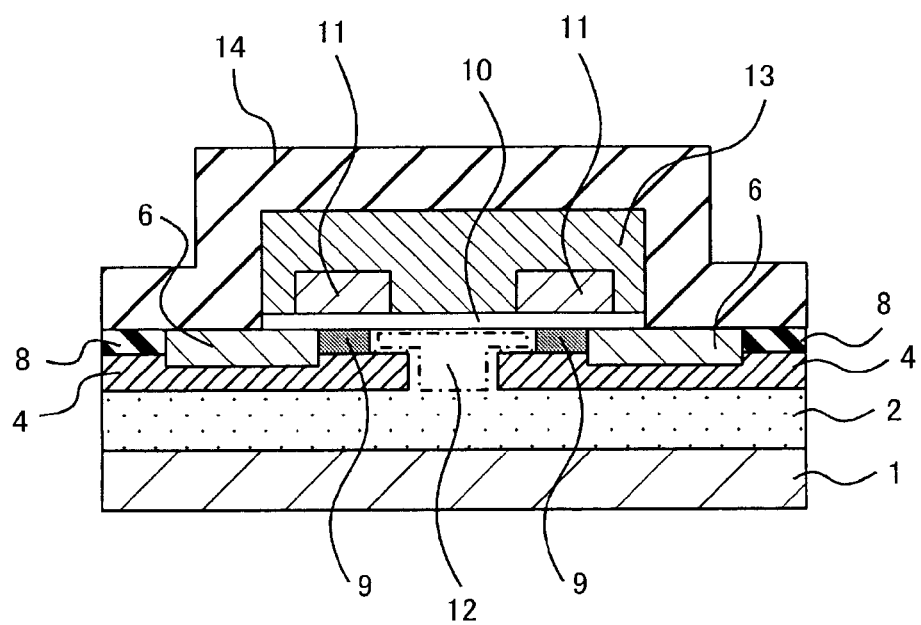
FIG. 6 is an explanatory view representing a manufacturing process for the silicon carbide semiconductor device according to Embodiment 1 of the present invention.

When the activation annealing is performed, the boron elements ion-implanted in the source regions 6 diffuse around the source regions 6 as represented by dashed lines "M" in FIG. 4. Here, because the silicon carbide wafer has a (0001) plane as the main surface, the diffusion coefficient in a direction along the (0001) plane becomes larger than that in a direction perpendicular to the (0001) plane. That is, the diffusion coefficient with respect to boron becomes larger in the direction along the plane (lateral direction) of the silicon carbide wafer than that in the depth direction (longitudinal direction) thereof. On the contrary, aluminum, nitrogen, and phosphorus elements as the impurities are nearly non-diffusible by the activation annealing. Therefore, their configuration profile when the ion implantation is performed remains without modification (refer to FIG. 4).

By the above described activation annealing, the boron elements having been ion-implanted in the source regions 6 are diffused to regions around the source regions 6; thereby, p$^-$-type (second conductive type) channel regions 9 are selectively formed so as to contact the inner sides (opposing sides) of the source regions 6, in portions on the well regions 4 sandwiched between the surface of the silicon carbide layer 2 and the well regions 4. That is, by the activation annealing, the boron elements as p-type impurities are diffused into the n$^-$-type silicon carbide layer 2; thereby, the n-type regions are inverted to the p-type ones, and thus the p$^-$-type channel regions 9 are formed (refer to FIG. 5).

Here, because the boron elements are p-type impurities, even if the elements diffuse into the well regions 4 as p-type ones or the contact regions 8 as p$^+$-type ones, a functional problem never occur.

Next, a gate oxide film 10 of silicon dioxide (SiO$_2$) is formed, in a high-temperature oxygen (O$_2$) atmosphere, on the entire surface of the silicon carbide layer 2. Then, a polysilicon film is formed, by a chemical vapor-phase growth method, on the surface of the gate oxide film 10, and thereafter, gate electrodes 11 are formed by removing unnecessary portions thereof by a wet or a dry etching method such as an RIE (reactive ion etching) method, using a resist layer as a mask therefor. In this process, the gate electrodes 11 are formed so as to cover the channel regions 9. More in detail, the gate electrodes 11 are formed so as to cover the channel regions 9, a part of a surface-exposed portion of the silicon carbide layer 2 in inner outsides of the channel regions 9, and a part of the source regions 6. Note that, the gate electrodes 11 are not formed over a depletion region 12 that is located in a portion of the silicon carbide layer 2 sandwiched between the well regions 4 and between the channel regions 9 (refer to FIG. 6).

Next, an interlayer insulating film 13 made of silicon dioxide (SiO$_2$) has been formed, by a chemical vapor-phase growth method using TEOS (tetraethoxysilane), on the surfaces of the gate oxide film 10 and the gate electrodes 11, and thereafter, the interlayer insulating film 13 and the gate oxide film 10 are partially removed, by a dry etching method such as an RIE method using a resist layer as a mask therefor, so as to expose the contact regions 8 and a part of the source regions 6. Then, the resist layer is also removed (refer to FIG. 6).

Next, a source electrode 14 as a first main electrode is formed, by a PVD (physical vapor deposition) method such as a spattering method, on the surfaces of the exposed contact regions 8, source regions 6, and interlayer insulating film 13. The source electrode 14 is electrically connected to the contact regions 8 and the source regions 6 (refer to FIG. 6).

Here, as an example of a material configuration to be the source electrode 14, aluminum (Al) can be used. If this is the case, nickel (Ni) alloy is formed to ensure Ohmic contact, on the surfaces of the exposed contact regions 8 and source regions 6.

Last, a drain electrode 15 as a second main electrode constituted of an electrical conductive film is formed, by a physical vapor-phase growth method such as a spattering method, on the rear face of the semiconductor substrate 1 (refer to FIG. 7).

Here, as an example of a material configuration to be the drain electrode 15, nickel (Ni)/gold (Au) laminate can be used. In this case, nickel (Ni) alloy is also formed, to obtain Ohmic contact, on the rear face of the semiconductor substrate 1.

As a result of the above-described processes, the planar MOSFET as the silicon carbide semiconductor device according to Embodiment 1 of the present invention is completed (refer to FIG. 7).

Here, in the planar MOSFET produced by such process, in order to relax the electric field strength at gate electrode edges inside the gate electrodes 11, that is, at the gate electrode edges positioned over the depletion region 12 (portions "N" in the figure), it is necessary that the well regions 4, the channel regions 9, and the gate electrodes 11 be in a positional relationship expressed by the following expression.

That is, as represented in FIG. 7, in a direction along the face of the silicon carbide wafer (a lateral direction), with respect to the inner sides of the source regions 6, given that the extending length of the well regions 4 is Lwell, that of the channel regions 9 is Lch, and that of the gate electrodes 11 is Lg, the following relationship is needed to be satisfied.

$$Lch < Lg < Lwell$$

When the relationship is satisfied, high electric field otherwise applied at the gate electrode edges inside the gate electrodes 11, represented by the portions "N" in FIG. 7, that is, at those over the depletion region 12, is shielded by the well regions 4.

Figure 9:
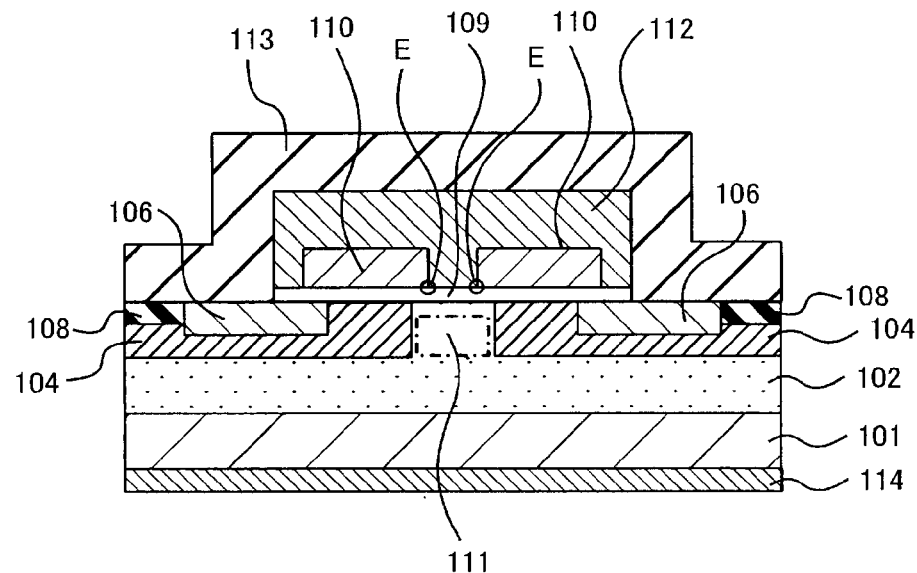
FIG. 9 is a cross-sectional view representing a conventional silicon carbide semiconductor device.
Figure 10:
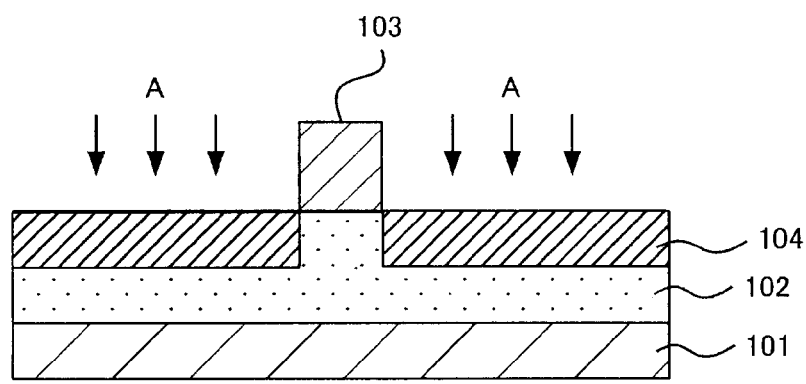
FIG. 10 is an explanatory view representing a manufacturing process for the conventional silicon carbide semiconductor device.
Figure 11:
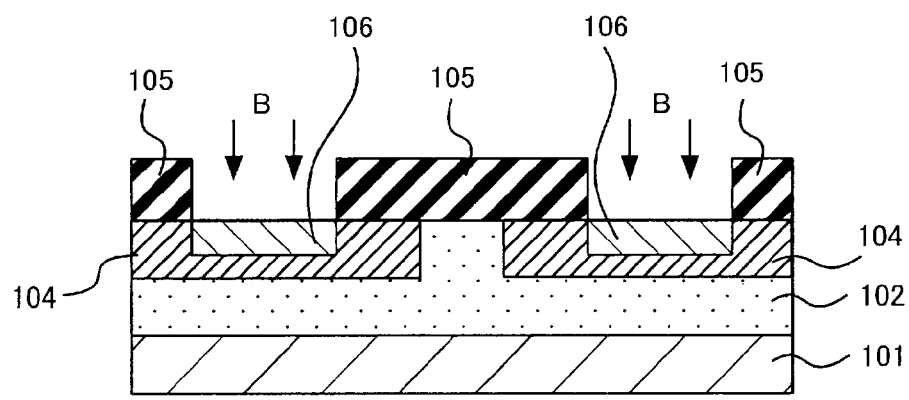
FIG. 11 is an explanatory view representing a manufacturing process for the conventional silicon carbide semiconductor device.
Figure 12:
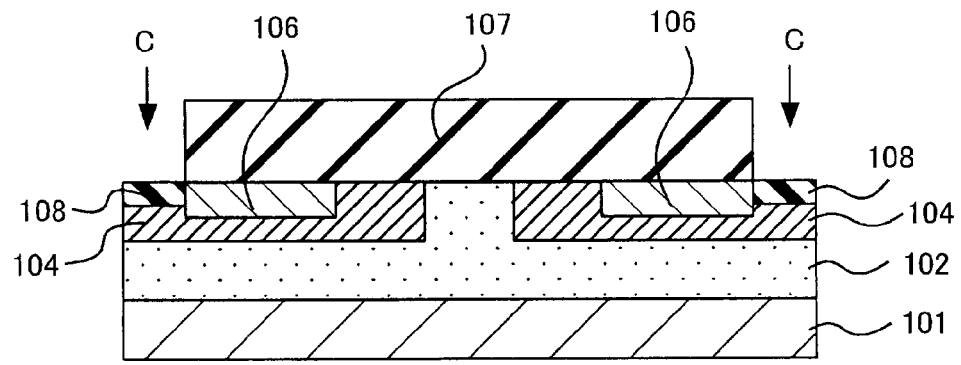
FIG. 12 is an explanatory view representing a manufacturing process for the conventional silicon carbide semiconductor device.
Figure 13:
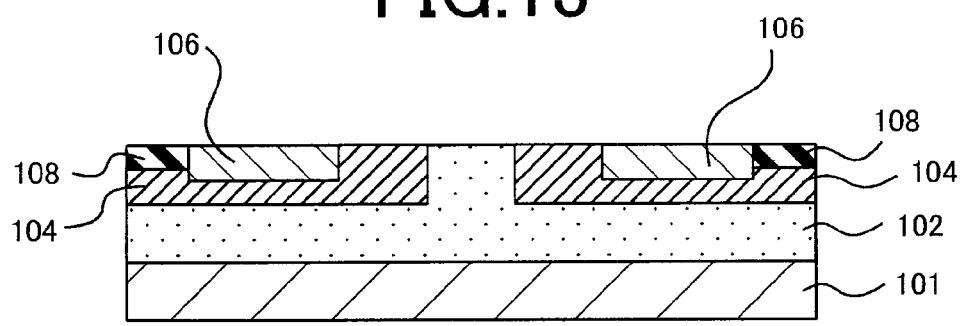
FIG. 13 is an explanatory view representing a manufacturing process for the conventional silicon carbide semiconductor device.
Figure 14:
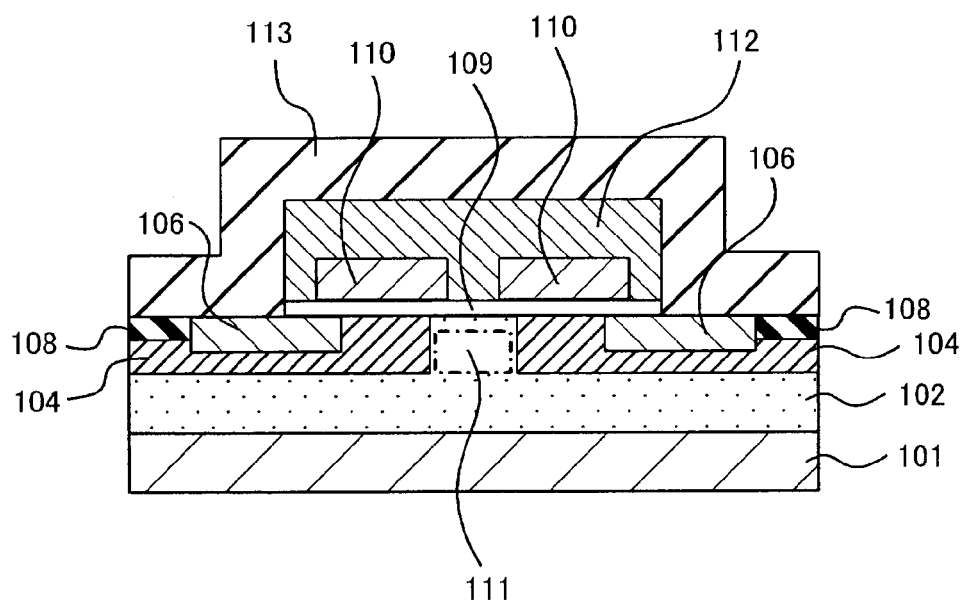
FIG. 14 is an explanatory view representing a manufacturing process for the conventional silicon carbide semiconductor device.

In the manufacturing method of the silicon carbide semiconductor device according to Embodiment 1 of the present invention, the channel regions 6 and the gate electrodes 11 are formed so that, regarding the extending lengths from the inner sides of the source regions 6 in the direction along the silicon carbide wafer, specifically the extending lengths towards the depletion region 12 from the inner sides of the source regions 6, given that the extending length of the well regions 4 is Lwell, that of the channel regions 9 is Lch, and that of the gate electrodes 11 is Lg, the relationship of Lch<Lg<Lwell is satisfied; and therefore, such a gate structure is realized in which the gate-electrode edges of the gate electrodes 11 that are positioned over the depletion region 12 and also over the surface-exposed portions of the silicon carbide layer 2, are shielded by means of the well regions 4 from electric field, whereby the applicable electric field is more relaxed in strength than that of the conventional gate structure illustrated in FIG. 9. Therefore, reliability of the silicon oxide film 10 as a gate oxide film can be ensured.

Moreover, in the manufacturing method of the silicon carbide semiconductor device according to Embodiment 1 of the present invention, the channel regions 9 are formed by boron diffusion due to the activation annealing, using implanted boron elements in the source regions 6. Therefore, except for adding the step of injecting the boron elements when the source regions 6 are formed, the conventional manufacturing steps represented in FIG. 10 through FIG. 14 can be utilized. It is also unnecessary to form another resist mask solely for boron-ion injection in order to form the channel regions 9. Accordingly, the cost for manufacturing the silicon carbide semiconductor device can also be suppressed.

Furthermore, in the manufacturing method for the silicon carbide semiconductor device according to Embodiment 1 of the present invention, because the channel regions 9 are formed by a self aligned manner utilizing diffusion of the boron elements implanted into the source regions 6, the channel length can be more preferably controlled than that in a case in which the channel regions 9 are formed by ion-implantation using a resist mask according to the channel regions. Thus, the manufacturing method is also effective for miniaturizing a silicon carbide semiconductor device.

Embodiment 2

Figure 8:
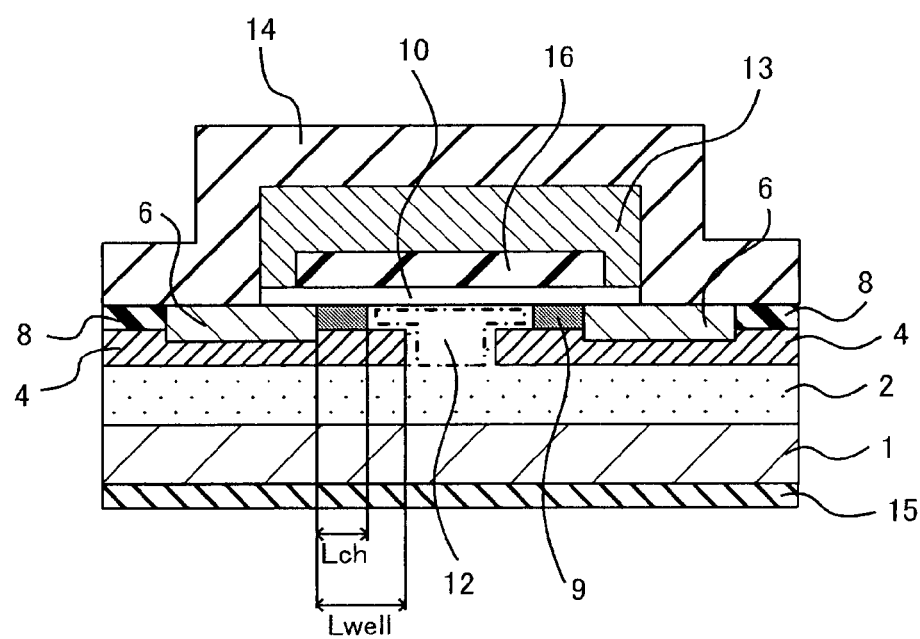
FIG. 8 is a cross-sectional view representing another silicon carbide semiconductor device according to Embodiment 2 of the present invention.

In Embodiment 1, the planar MOSFET has been represented in which the inner side portion of the gate electrodes 11 is removed from over the depletion region 12. Alternatively, as represented in FIG. 8, in a case in which a gate electrode 16 is formed entirely over the depletion region 12, an effect can also be achieved that the electric field applied to the gate electrode 16 is relaxed. Therefore, reliability of the gate oxide film 10 can be ensured. Here, in Embodiment 2, because the configuration except for the gate electrode 16 is the same as that represented in FIG. 7 of Embodiment 1, the same numerals as those in FIG. 7 are applied to the corresponding elements, and the explanation of them is thus omitted here. Additionally, regarding manufacturing steps, the device can be easily manufactured by using the same steps as described in Embodiment 1; therefore, its explanation is omitted here.

Here, in Embodiment 2, the extending lengths, in the direction along the face of the silicon carbide wafer, from the inner sides of the source regions 6 towards the side of the depletion region 12 are needed to be formed so that, when that of the well regions 4 is Lwell, and that of the channel regions 9 is Lch, a relationship of Lch<Lwell is satisfied.

Moreover, even in the configuration in Embodiment 2, not only the manufacturing cost can be suppressed but also the channel length can be suitably controlled, as represented in Embodiment 1.

Here, in Embodiments 1 and 2, although the explanation has been made each for a case of the planar MOSFET as an example of the silicon carbide semiconductor device, similar configurations are, of course, applicable to another silicon carbide semiconductor device having a similar gate structure, for example, a planar IGBT. In order to apply these configurations to the planar IGBT, a second conductive-type collector layer may be provided on a side contacting the second main electrode 15 of the semiconductor substrate 1.

Although, in Embodiments 1 and 2, the processes have been explained using aluminum as the first impurity, and nitrogen and phosphorus as the second impurity, which are nearly non-diffusible in the silicon-carbide layer 2 during the activation annealing, and using boron as the third impurity that is diffusible into the silicon-carbide layer 2 during the activation annealing, other impurities having characteristics equivalent to those represented above, specifically having diffusion characteristics equivalent thereto in the silicon-carbide layer 2 during the activation annealing, can be utilized instead. Accordingly, use of these other impurities is of course in the scope of the invention.

What is claimed is:

1. A manufacturing method of a silicon carbide semiconductor device comprising:
   a step of forming inside a first conductive-type silicon carbide layer second conductive-type well regions by ion-implanting a first impurity that is non-diffusible by activation annealing but forms a second conductive-type region in the silicon carbide layer;
   a step of forming in portions sandwiched between a surface of the silicon carbide layer and their respective well regions first conductive-type source regions by ion-implanting a second impurity that is non-diffusible by the activation annealing but forms a first conductive-type region in the silicon carbide layer, and a third impurity that is diffusible by the activation annealing and forms a second conductive-type region in the silicon carbide layer;
   a step of forming, in portions sandwiched between the surface of the silicon carbide layer and their respective well regions, and in the silicon carbide layer on inner outsides of the source regions, second conductive-type channel regions by diffusing by the activation annealing the third impurity having been included in the source regions; and
   a step of forming over a surface of the silicon carbide layer gate electrodes, intervening between the surface and the electrodes a gate insulation film, so as to cover the channel regions, a part of a surface-exposed portion of the silicon carbide layer in inner outsides of the channel regions, and a part of the source regions; and
   the well regions, the channel regions, and the gate electrodes being formed so that, given that extending lengths, with respect to the inner sides of the source regions, of each of the well regions, the channel regions, and the gate electrodes are Lwell, Lch, and Lg, respectively, a relationship of Lch<Lg<Lwell is satisfied.

2. A manufacturing method of a silicon carbide semiconductor device as recited in claim 1, wherein the first impurity includes aluminum, the second impurity includes nitrogen and/or phosphorus, and the third impurity includes boron.

3. A manufacturing method of a silicon carbide semiconductor device comprising:
   a step of forming inside a first conductive-type silicon carbide layer a second conductive-type well regions by ion-implanting a first impurity that is non-diffusible by activation annealing but forms a second conductive-type region in the silicon carbide layer;
   a step of forming in portions sandwiched between a surface of the silicon carbide layer and their respective well regions first conductive-type source regions by ion-implanting a second impurity that is non-diffusible by the activation annealing but forms a first conductive-type region in the silicon carbide layer, and a third impurity that is diffusible by the activation annealing and forms a second conductive-type region in the silicon carbide layer;

a step of forming, in portions sandwiched between the surface of the silicon carbide layer and their respective well regions, and in the silicon carbide layer on inner outsides of the source regions, second conductive-type channel regions by diffusing by the activation annealing the third impurity having been included in the source regions; and a step of forming over a surface of the silicon carbide layer a gate electrode, intervening between the surface and the electrode a gate insulation film, so as to cover the channel regions, a part of a surface-exposed portion of the silicon carbide layer in inner outsides of the channel regions, and a part of the source regions; and the well regions, and the channel regions being formed so that, given that extending lengths, with respect to the inner sides of the source regions, of each of the well regions, and the channel regions are Lwell, and Lch, respectively, a relationship of Lch<Lwell is satisfied.

4. A manufacturing method of a silicon carbide semiconductor device as recited in claim 3, wherein the first impurity includes aluminum, the second impurity includes nitrogen and/or phosphorus, and the third impurity includes boron.

* * * * *